United States Patent [19]

Hiraoka

[11] Patent Number: 5,341,094
[45] Date of Patent: Aug. 23, 1994

[54] METHOD OF GROUPING OF VARIABLE CAPACITANCE DIODES HAVING UNIFORM CHARACTERISTICS

[75] Inventor: Shigeru Hiraoka, Himeji, Japan

[73] Assignee: Kabushiki Kaisha Toshiba, Kawasaki, Japan

[21] Appl. No.: 26,076

[22] Filed: Mar. 4, 1993

Related U.S. Application Data

[63] Continuation of Ser. No. 666,745, Mar. 8, 1991, abandoned.

[30] Foreign Application Priority Data

Mar. 9, 1990 [JP] Japan .................................. 2-59749

[51] Int. Cl.⁵ ............................................. G01R 31/22
[52] U.S. Cl. ................................. 324/767; 324/766
[58] Field of Search ............... 329/73.1, 658, 158 R, 329/158 D, 158 F; 437/8, 217, 220; 209/573; 29/827

[56] References Cited

U.S. PATENT DOCUMENTS

| | | | |
|---|---|---|---|
| 2,999,587 | 9/1961 | Campbell | 324/158 D |
| 3,614,614 | 10/1971 | Starliper | 324/158 D |
| 3,702,438 | 11/1972 | Cole, Jr. | 324/158 F |
| 3,778,713 | 12/1973 | Jamison | 324/158 D |
| 3,914,690 | 10/1975 | Shelnutt | 324/158 D |
| 4,985,988 | 1/1991 | Littlebury | 324/158 R |
| 5,005,338 | 4/1991 | Kemkers et al. | 209/573 |

FOREIGN PATENT DOCUMENTS

| | | |
|---|---|---|
| 0216403 | 8/1986 | European Pat. Off. . |
| 573781 | 9/1977 | U.S.S.R. . |
| 2220754 | 1/1990 | United Kingdom . |

*Primary Examiner*—Vinh Nguyen
*Attorney, Agent, or Firm*—Foley & Lardner

[57] ABSTRACT

A characteristic testing method for variable capacitance diodes includes separating element pellets of variable capacitance diodes and picking up pellets neighboring each other in any one of a longitudinal, lateral, and oblique direction. The pellets are rearranged in a row in a frame according to the order of picking up and the rearranged pellets are packaged to form capacitor components. The characteristics of the capacitor components are measured to reject defective capacitor components and to obtain a group of successive good components. Quality judgement criteria are set on the basis of the results of the testing.

4 Claims, 7 Drawing Sheets

METHOD OF GROUPING OF VARIABLE CAPACITANCE DIODES HAVING UNIFORM CHARACTERISTICS

This application is a continuation of application Ser. No. 07/666,745, filed Mar. 8, 1991, now abandoned.

BACKGROUND OF THE INVENTION

This invention relates to a characteristic testing method for variable capacitance diodes, and more particularly, to a method used as an inspection method at the time of shipping or forwarding diode elements to which taping is implemented.

Variable capacitance diodes (hereinafter also abbreviated as elements) are used in place of double, triple, or quadruple mechanical variable capacitors for the receiver tuner of televisions, or radio receivers. For one tuner, two to four variable capacitance diodes are necessarily used. These elements are required to have voltage versus capacitance characteristics uniform with each other (such that they can be paired with each other). Further, for reasons of customer's work, e.g., sixty (60) elements or more having the uniform characteristics are put together (which will be called pairing) into one block. Ordinarily, several blocks per each reel, e.g., 3000 diodes are forwarded in a form when they are to be subjected to taping.

Generally, several thousand variable capacitance diode pellets are formed on a single wafer.

Figure 1:
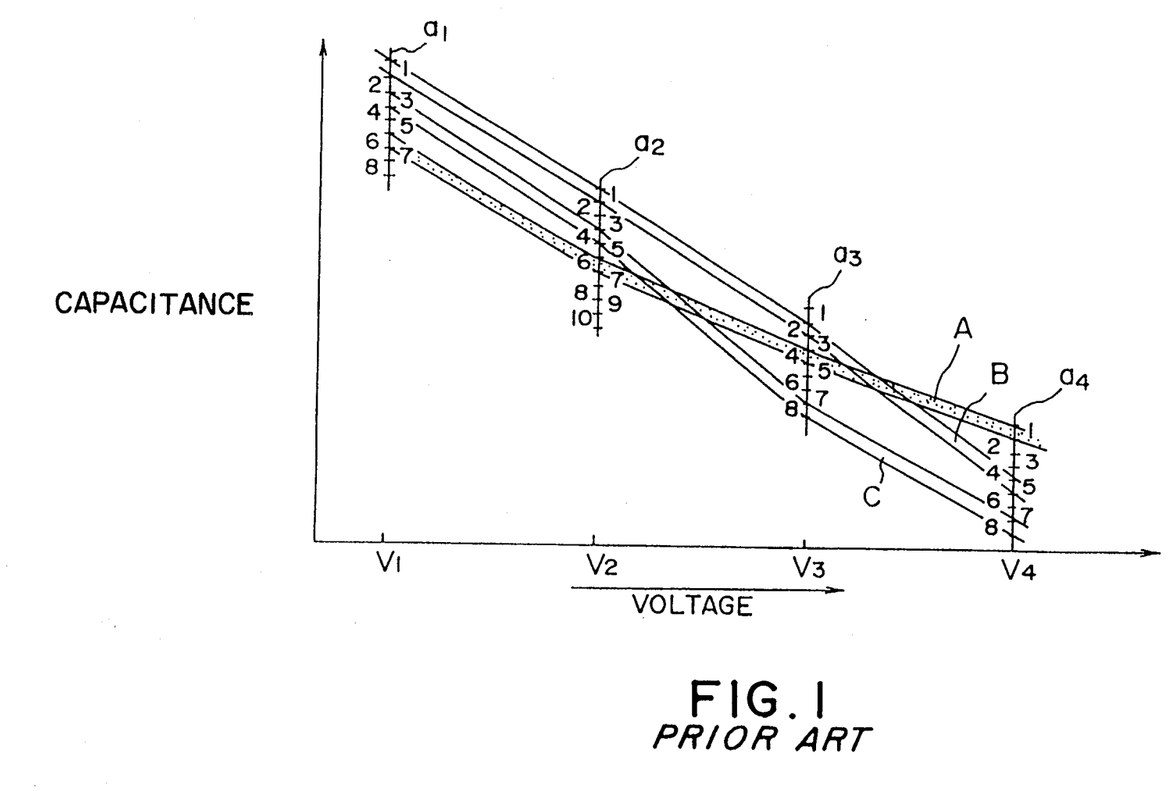
FIG. 1 is a graphical representation of a conventional pair-sorting method based on combination.
Figure 2:
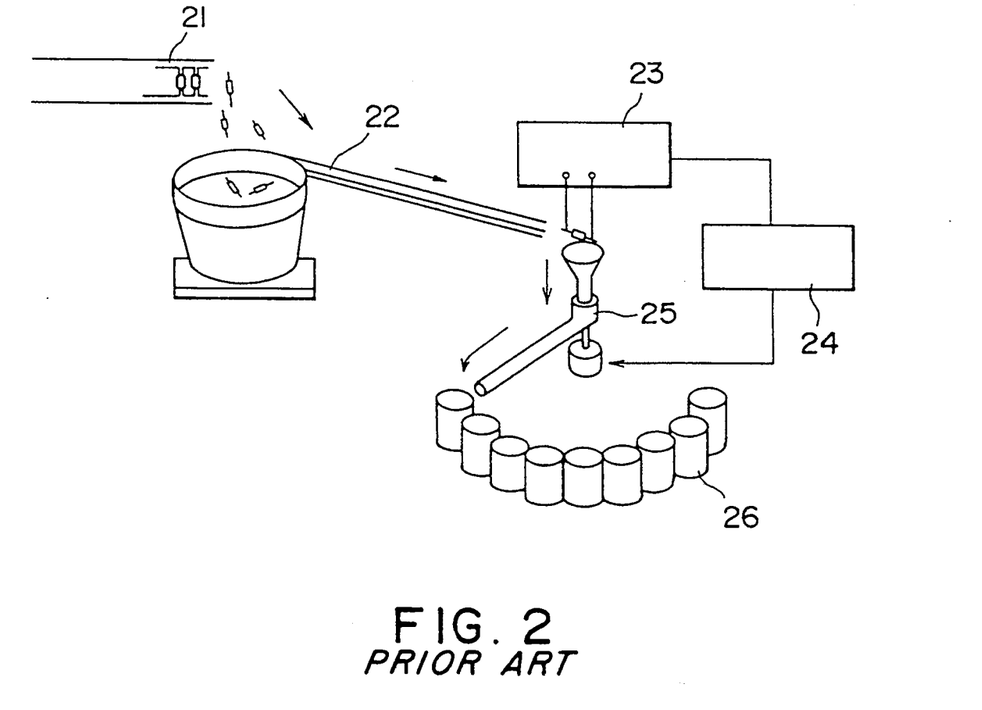
FIG. 2 is a schematic view showing a conventional testing and sorting process.

A conventional method of pair-sorting a plurality of elements (e.g., several thousand) will now be described with reference to FIGS. 1 and 2. In FIG. 1, the abscissa represents voltage, and the ordinate represents capacitance. In this figure, longitudinal line segments $a_1$, $a_2$, $a_3$ and $a_4$ represent capacitance distributions of the plurality of elements at voltages $V_1$, $V_2$, $V_3$ and $V_4$, respectively. The capacitance range of elements to be paired is ordinarily limited to 1 to 3%. For example, in the case where the capacitance is limited to 2%, limits are provided for every capacitance range of 2%, and line segments $a_1$ to $a_4$ are divided into approximately eight to ten sections, respectively. The numerals attached to the longitudinal line segments indicate section Nos., respectively. Combinations are prepared by the sections at respective voltages to attach sorting Nos. to those combinations. For example, the combination of the sorting No. A is (6—6—4—1), the combination of the sorting No. B is (1—2—5), and the combination of the sorting No. C is (3—4—8—8). Since the polygonal line zone A connecting two adjacent two section limits (the same reference numerals as those of the sorting Nos. are used for reasons of convenience) represents a voltage versus capacitance characteristic group having the uniform characteristics where the capacitance range is approximately 2% or less, elements belonging to such combinations can be paired.

When a new combination occurs while accommodating elements having the same sorting Nos. into the same bottles, respectively, that sorting No. is registered with respect to a new bottle to continue sorting. In accordance with such a method, sorting is conducted into about 500 groups at the maximum. Further, in the case of conducting shipping in the form of a taping reel, since one reel is comprised of 3000 diodes, elements which have undergone bottle sorting are subjected to taping in order from the bottle having main elements therein so that respective reels have 3000 elements.

Figure 3:
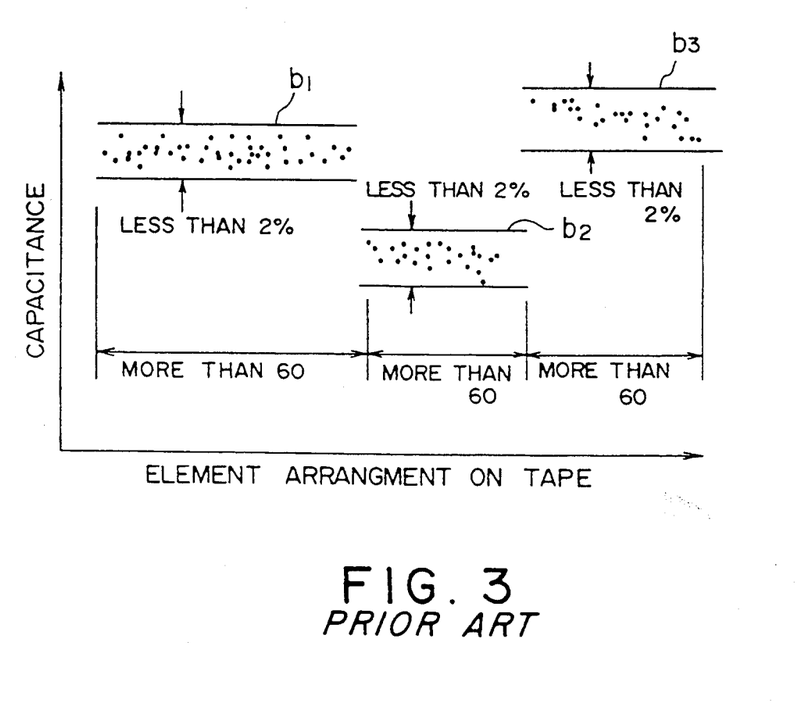
FIG. 3 is a graphical representation of a capacitance distribution of elements subjected to taping of the prior art.

Explanation will be given in more detail with reference to FIG. 2. Initially, 40 plastic molded elements placed on a frame 21 are separately cut off and are arranged for a second time by means of a parts feeder 22 to measure capacitance values every respective voltages ($V_1$ to $V_4$) by means of a characteristic measurement device 23 to determine bottles 26 with respect to respective combinations by means of a controller 24 to accommodate them into bottles of corresponding sorts by means of a sorter 25. Further, in the case of attempting to carry out taping, although not shown, elements are arranged for a second time by using the parts feeder from the bottle having many bottles therein, and are then subjected to taping. FIG. 3 is a graph in which the arrangement position of elements on the tape and the element capacitance (e.g., at 14 volts) are shown on the abscissa and the ordinate, respectively In this figure, $b_1$, $b_2$ and $b_3$ represent the sorting Nos. of bottles. All these elements have the capacitance range of 2% or less and have characteristics such that those of 60 elements or more are in harmony with each other.

However, the above-mentioned conventional method has the follows problems.

(1) A special handler (sorter) capable of conducting sorting in a broad range is required, resulting in a high cost of installation.

(2) Since sorting is conducted even into approximately 500 groups, there may occur wastefulness in the space, the labor and the time for management of the product. Further, there is the possibility that elements of any different group may be mixed because of an error in handling.

(3) Ordinarily, the taping reel is comprised of 3000 elements, but there exists the limitation that, e.g., sixty elements or more must be included within each block. Accordingly, elements belonging to bottles including 60 elements or less Cannot be subjected to taping. Namely, products belonging to bottles including elements or less can be only forwarded in the form of bagging. For this reason, balance between products to be subjected to taping and products subjected to bagging is required.

(4) Since elements belonging to a bottle including two elements or less are considered to be an inferior good as the result of bottle-sorting, yield becomes poor.

(5) Since elements are sorted twice using the parts feeder, products may be deteriorated.

As described above, in the case of variable capacitance diodes, elements having voltage versus capacitance characteristic curves in harmony with each other are put together as one block (group). Thus, products are forwarded with a plurality of blocks being attached on each taping reel. In the conventional art, since sorting is conducted into groups of even 500, not only there results increased wastefulness in the installation, space, labor, and time, etc. for inspection or sorting, but also there occurs taping reel products and products subjected to bagging, disadvantageously resulting in low productivity. On the other hand, the capacitance characteristic distribution of elements irregularly varies depending on lots, and location within the wafer. However, the conventional method cannot flexibly cope with such a characteristic distribution change.

SUMMARY OF THE INVENTION

An object of this invention is to provide a characteristic inspection method for variable capacitance diodes, which can forward or ship inspected products in the form of a taping reel as they are without the necessity of sorting elements into a large number of blocks in dependency upon the element characteristic, and which can maintain a reasonable inspection in consideration of changes in the capacitance characteristic distribution.

According to the present invention, there is provided a characteristic testing method for variable capacitance diodes comprising the steps of: separating element pellets of variable capacitance diodes formed in a matrix form on a semiconductor wafer to rearrange separate pellets in a row so that pellets neighboring each other in any one of the longitudinal, lateral and oblique direction of the pellet serve as adjacent pellets, implementing formation of elements on the group of pellets arranged in a row in accordance with an arrangement order from one end toward the other end of the group of pellets in a row, measuring the characteristic of those elements to conduct a quality judgment of the elements to reject defective elements from the arrangement without putting the arrangement order into disorder, collecting characteristic measurement data of a plurality of good elements in accordance with an arrangement order from an element to be judged toward the one end of the arrangement, and setting quality judgment criteria of the elements to be judged for every the elements to be judged on the basis of the characteristic measurement data.

In accordance with this invention, by drawing attention to the fact that pellets neighboring with each other on a wafer are extremely similar to each other with respect to the quality, and/or the manufacturing condition, etc., so the pairing ability (voltage versus capacitance characteristic curves are very similar), an approach is employed to omit a conventional sorting process. Namely, an approach is employed to rearrange pellets in a row so that pellets having good pairing ability are adjacent with each other to implement packaging, e.g., plastic molding, etc. to the pellets without putting the arrangement order into disorder to implement formation of elements on the pellets thereafter to permit those elements to be forwarded in the form of a taping reel as they are while maintaining the arrangement order of good pairing ability from the process for the characteristic measurement, and judgment of elements, etc. up to the taping process to set a quality judgment criterion as to whether or not an element to be judged can be paired with a judged element immediately preceding thereto, thus to modify the quality judgment criterion on the basis of data indicative of a plurality of (e.g., 5 to 16) judged good elements arranged in a manner close to that of elements to be judged in order to permit this inspection method to flexibly cope with changes in the capacitance distribution. It is desirable that setting of the quality judgment criterion is repeatedly carried out for every elements to be judged in the process of removing poor or inferior elements. By employing such an approach, even if unevenness of the capacitance of the entirety of elements arranged (e.g., 3000 elements) is large (e.g., 10%), unevenness can fall within a range (e.g., 2%) such that elements can be paired in a partial arrangement.

In accordance with the characteristic testing method for variable capacitance diodes, inspected-products can be forwarded as they are in a form such that taping is implemented thereto, without necessity of sorting elements into a large number of blocks according to the element characteristics as encountered with the prior art. The taping forwarding ratio of the product can be equal to 100%. Further, in accordance with the testing method of this invention, even if there exists unevenness in the capacitance depending on the kind of lots, and/or location within a wafer, changes in the capacitance characteristic distribution can be flexibly grasped or recognized. Thus, an efficient and reasonable inspection can be maintained.

DESCRIPTION OF THE PREFERRED EMBODIMENT

Figure 4:
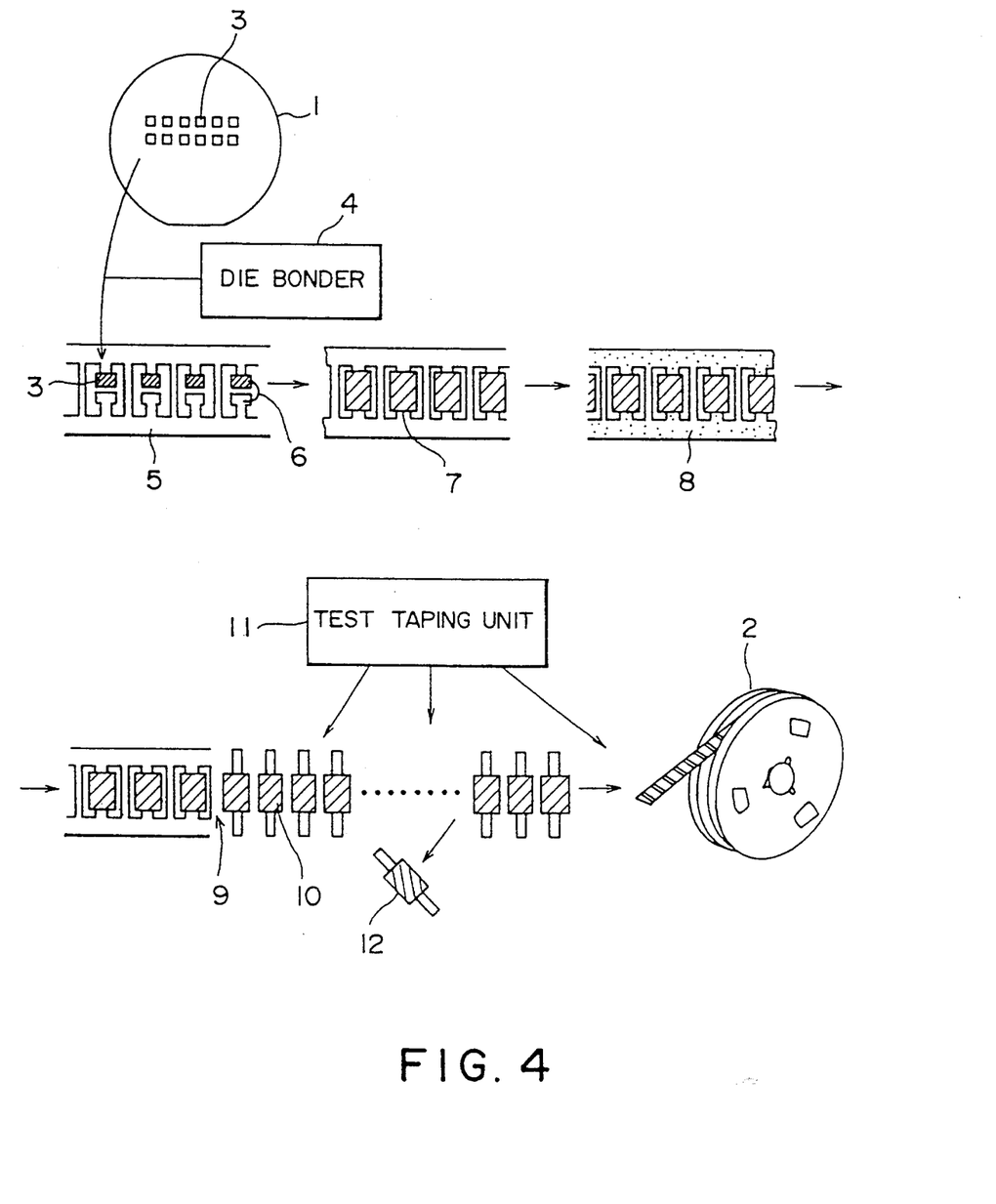
FIG. 4 is a schematic view showing an example of a flow of the process in the inspection method of this invention.
Figure 9:
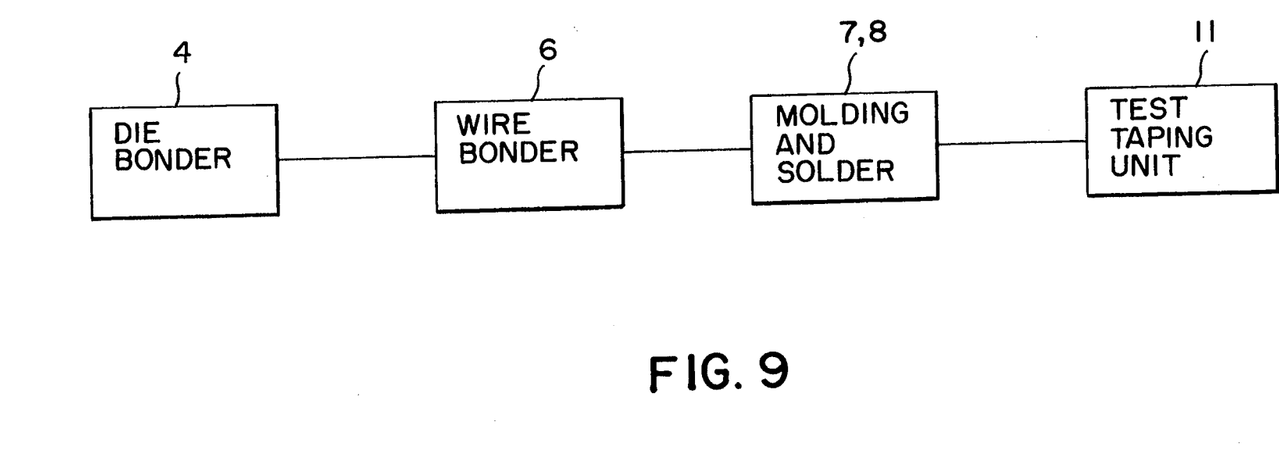
FIG. 9 is a block diagram showing the apparatus used for implementing the method according to the present invention.

FIG. 4 is a schematic view and FIG. 9 is a block diagram showing an example of a flow of the manufacturing process of this invention from the process for preparing a wafer on which variable capacitance diode elements of the USC (Ultra Small Coaxial) type have been formed to the process for preparing a taping reel product 2.

Figure 5A:
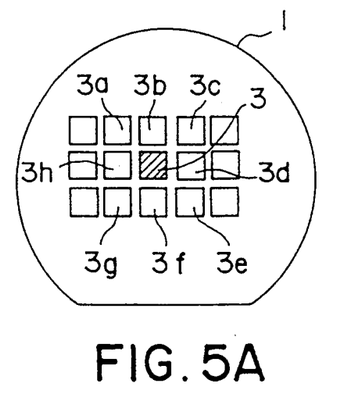
FIGS. 5A to 5D are schematic views showing an embodiment of a method of rearranging element pellets on a wafer in a row, respectively.

On the wafer 1, a large number of element pellets 3 are arranged and formed in a matrix form. In order to separate the pellets from each other with the wafer 1 being attached on the adhesive sheet, the surface of the wafer 1 is scratched. The adhesive sheet is expanded as a whole to separate respective pellets. The pellets thus separated are picked up one by one by means of a die bonder 4. These pellets are then arranged in a row on a frame 5, and are subjected to bonding. In accordance with the arrangement method of this invention, pellets are arranged in a row in a manner that pellets neighboring each other in any one of longitudinal, lateral and oblique directions constitute adjacent pellets. As shown in FIG. 5A, the pellets in contact with the pellet 3 on the wafer 1 are the eight pellets $3a$ to $3h$. As the method of rearranging pellets in contact with each other so that they are in a row, there are enumerated a one-row picking up method shown in FIG. 5B, a three-row picking-up method shown in FIG. 5C, and an n-row picking up method shown in FIG. 5D. In these figures, the arrow 12 indicates the order for picking up pellets 3 from the wafer 1.

Figure 5B:
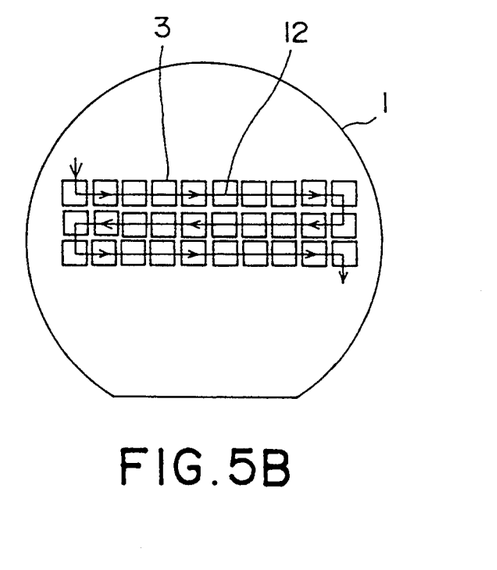
Figure 5C:
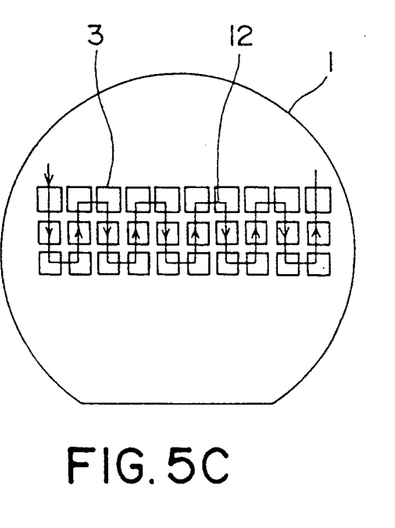
Figure 5D:
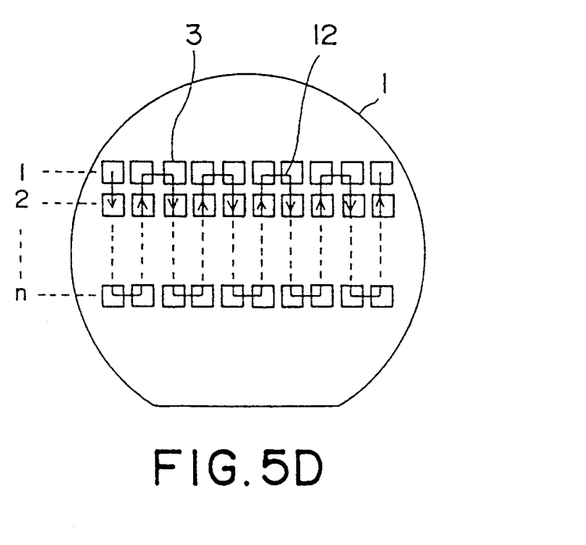

Generally, a picking up method approximately ranging from three-row to ten-row, e.g., five-row picking up method is frequently used. The gradient in the capacitance changes along the arrangement of pellets rearranged so that there are in a row in the case of the several-row picking up method becomes extremely more gentle than that in the case of the one-row picking up method. Further, by improving the unevenness of the voltage versus capacitance characteristic of pellets within the wafer, the optimum value of n of the n-row picking up method varies.

Turning back to FIG. 4, pellets arranged in a row on the frame 5 undergo a packaging process such as wire bonding 6, plastic molding 7, and solder dipping 8, etc. with the arrangement order thereof being maintained by a well known method. Thus, pellets 3 are brought into the state where the formation of elements is implemented thereon.

In order of the element arrangement of the frame, quarrying 9 is carried out. Thus, elements 10 are provided. Elements 10 thus quarried are conveyed or carried to a test taping unit 11 in order from the element located at one end (at the leading position).

In the unit 11, a voltage impact test, a d.c. characteristic test, and a voltage versus capacitance characteristic measurement of elements, etc. are carried out in accordance with the order of arrangement. Finally, a pairing ability judgment test is implemented for elements which have been judged to be free from defects by these tests. Elements 12 rejected by any test mentioned above are removed from the arrangement. On the contrary, only elements accepted by all the tests are subjected to taping in accordance with the above-mentioned arrangement order.

The pairing ability judgment test which is one feature of this invention will now be described. The pairing ability judgment test consists of a temporary or provisional judgment test and a matching test. In accordance with the temporary judgment test, elements of which capacitance values greatly deviate from acceptable values given by the capacitance change curve every successive elements (see the curve of FIG. 7 in which the arrangement order of elements and the capacitance of elements are plotted on the abscissa and ordinate, respectively) are removed because they are inconvenient as elements to be paired. Further, in accordance with the matching test, judgment as to whether or not a desired number of (e.g., 16) elements arranged in succession can be paired with each other is made.

The matching test is carried out every element in conjunction with the temporary judgment test. Since two to four elements are used for each tuner as described above, it is sufficient that two to four elements have voltage versus characteristic curves in harmony with each other, i.e., can be paired with each other per each block. However, since elements are automatically inserted by means of the taping reel on the customer's side, it is required that a desired successive m×p (m is the number of elements necessary for each tuner substrate, and p is the number of substrates that the inserting machine works correctively at a time) can be paired with each other. At present, there is the greatest demand for m=4 and p=4. Accordingly, arbitrary successive 16 elements arranged on the tape of the taping reel are required to be paired with each other. The matching test is carried out for this purpose.

In regard to the standard of 16 pairs, when the lowest value of the capacitance and the highest value of the capacitance are assumed as Cmin [pF] and Cmax [pF] of 16 elements, respectively, the following relationship holds:

$$\alpha = ((Cmax - Cmin)/Cmin) \times 100 \ [\%]$$

where $\alpha$ is called matching. Although the value of $\alpha$ varies to some extent depending on the kind of products, the destination, and the like, it is controlled within a range of 1.5 to 2.5% at the maximum.

An embodiment of the pairing ability judgment test will now be described.

The pairing ability judgment test is classified into the initial routine 1, the initial routine 2 and the steady routine in correspondence with the flow of the test. This is because a necessary number of preceding good elements for setting the quality judgment reference are not provided. The initial routine 1 is applied to the flow of test until a plurality of (e.g., five) preceding good elements necessary for setting the judgment criterion of the temporary judgment test from the leading element of the arrangement are provided, the initial routine 2 is applied to the flow of the test until a plurality of (e.g., 16) preceding good elements necessary for setting the judgment criterion of the matching test, and the steady routine is applied to flows of respective tests subsequent thereto.

Figure 6:
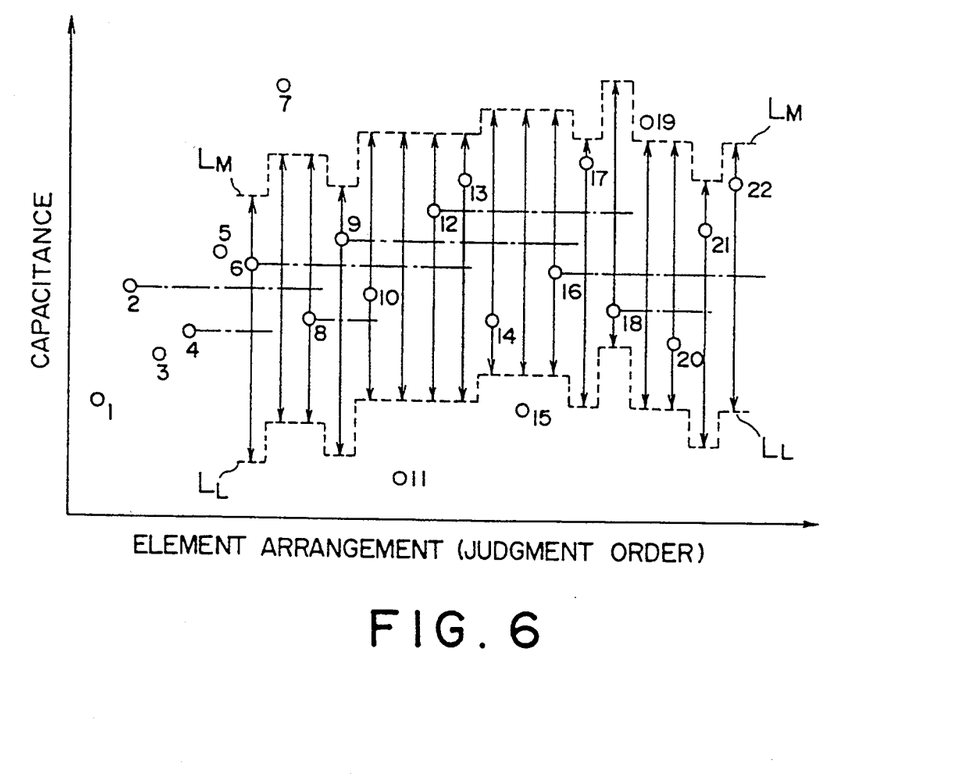
FIG. 6 is a graphical representation of an embodiment of a pairing ability judgment test in this invention.

In FIG. 6, the abscissa represents the element arrangement and the judgment order, and the ordinate represents capacitance data (at a fixed voltage) of the element. In accordance with the arrangement order, inspection is conducted in a direction from the element 1 (located at the leading position) to the element 22.

The initial routine 1 is first started by finding out elements having a center value of five capacitance data of elements 1, 2, 3, 4 and. 5. In this case, the element 4 has the center value. This center value is considered as an initial reference value. The allowed change range of the capacitance is set to a value from ±0.5% to ±1.5%. In this embodiment, the allowed change range is set to ±1%. The upper capacitance limit (reference value×1.01) and the lower capacitance limit (reference value×0.99) are set. As stated above, elements 1 to 5 are used for the initial processing, and element 6 and elements succeeding thereto are used for the pairing ability judgments test. If the capacitance data of the element 6 is between limits $L_M$ and $L_L$, the element is judged to be good as the result of the temporary judgment. Further, $\alpha$-values between the elements 1 to 5 and the element 6 are calculated. Examination as to whether or not these values fall within a range of the matching standard (e.g., less than 2%) is carried out. If they fall within that range, the matching is judged to be good. Because the element 6 is judged to be good as the result of both the temporary judgment and the matching test, it is caused to be passed. The element 7 is then judged. At this time, a center value of five capacitance data of the elements 6, 5, 4, 3 and 2 from the element to be judged 7 toward the leading element 1 is calculated. In this case, since the element 2 gives that center value, data of the element 2 is considered as a reference value. In a manner similar to the above, the capacitance limits $L_H$ and $L_L$ are set. Since the capacitance data of the element 7 is not between limits $L_H$ and $L_n$, this element is judged to be poor or inferior as the result of the temporary judgment. Accordingly, the matching test is not conducted. Since the element 7 is judged to be poor, both the temporary judgment reference value and the capacitance limits $L_M$ and $L_L$ of an element to be judged do not change. Thus, the element 8 is judged to be good as the result of the temporary judgment. Subsequently, $\alpha$-values between the elements 1 to 6 and the element 8 are calculated to examine whether or not they satisfy the matching standard. In this case, since the α-values thus calculated satisfy this standard, the element 8 is judged to be good as the result of the matching test as well. Thus, that element is caused to be passed. The judgment of an element 9 is then conducted. In a manner similar to the above, a center value of data of five capacitance values of good elements 8, 6, 5, 4 and 3 is calculated. The capacitance value of the element 8 is in turn considered as a new reference value, and capacitance limits $L_H$ and $L_n$ are newly set. Since the capacitance data of the element 9 is between the limits $L_M$ and $L_L$, the element 9 is judged to be good as the result of the temporary judgment. Subsequently, α-values between the elements 1 to 8 except for the element 7 and the element 9 are calculated to examine as to whether or not those values satisfy the matching standard (also in this case, those values are judged to satisfy the matching standard). Since the element 9 is judged to be good as the result of both the temporary judgment test and the matching test, that element is caused to be passed. In accordance with a method similar to the above, the pairing ability judgment test is conducted. As a result, the elements 10, 11 and 12 are judged to be good, poor and good, respectively. At this time, the elements 6, 8, 9, 10 and 12 are finally judged as a good article. At the time these five elements have been judged to be good, the initial routine 1 is completed.

In the initial routine 2, subsequently to the initial routine 1, data of five good elements in accordance with the arrangement order from an element to be judged are used to make a temporary judgment in a manner similar to the above. Further, the matching test is conducted as follows. α-values between good elements from an element to be subjected to temporary judgment to the element 6 are calculated to examine as to whether or not those values satisfy the matching standard. In this way, when 16 good elements in total including five elements in the initial routine 1 are passed, this routine is completed to enter the steady routine.

In the steady routine, the pairing ability judgment test of the n-th element of the arrangement order is carried out as follows. The temporary judgment test is conducted by finding out a center value from the capacitance data of five good elements in accordance with the arrangement order from an element to be judged n toward the leading element, e.g., elements n-1, n-3, n-4, n-5 and n-6 (element n-2 is assumed as a poor article) to assume this center value as a reference value, and to determine capacitance limits $L_H$ and $L_L$ in accordance with the same method as that in the initial routine. Further, the matching test is carried out by calculating α-values from capacitance data from capacitance data of the element to be judged n and 15 good elements, e.g., elements n-1, n-3, n-4, . . . n-6 (those elements except for the element 2 are assumed to be all good article) to examine whether or not those values satisfy the matching Standard. Elements which have been judged to be good as the result of both the temporary judgment test and the matching test are caused to be passed as a good element.

Figure 8:
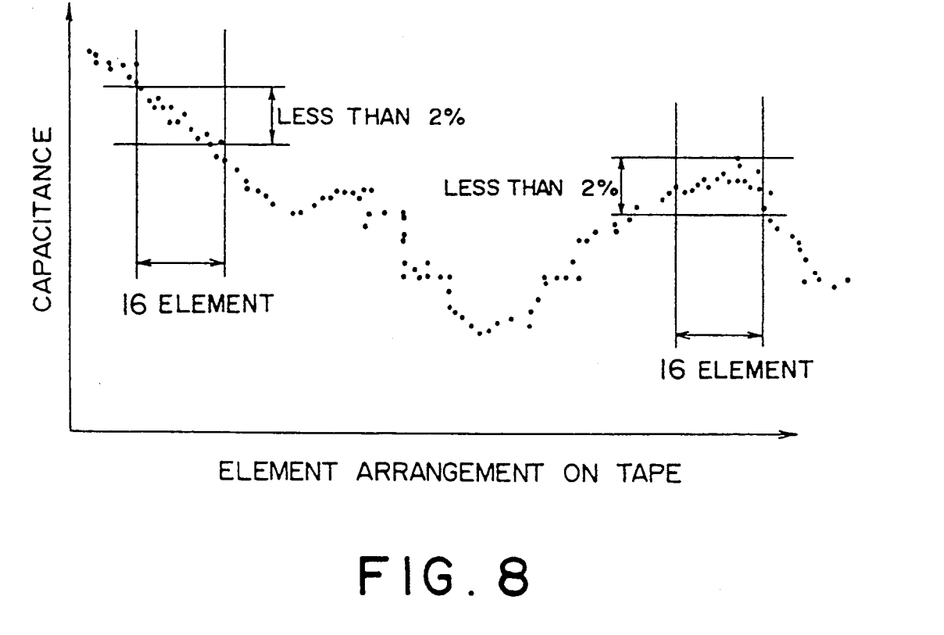
FIG. 8 is a graphical representation of a capacitance distribution of elements subjected to taping of this invention.

FIG. 8 is a graphical representation of an example of a characteristic distribution of elements subjected to taping wherein the abscissa represents the number of elements arranged in order of taping, and the ordinate represents the capacitance. In this case, even if 16 elements successive at an arbitrary portion of the arrangement are taken out, the pairing ability holds.

In the pairing ability judgment test of the above-mentioned embodiment, the number of preceding good elements used for setting a quality judgment criterion is five in the case of the temporary judgment test and 16 in the case of the matching test. However, it is a matter of course that the number of preceding good elements is not limited to the above mentioned-value in each test. Further, while a center value of capacitance data of a plurality of preceding good elements is used as the judgment reference value, a mean value, a value of substitution of cubic function approximate expression (least square), or the like may be used.

Figure 7:
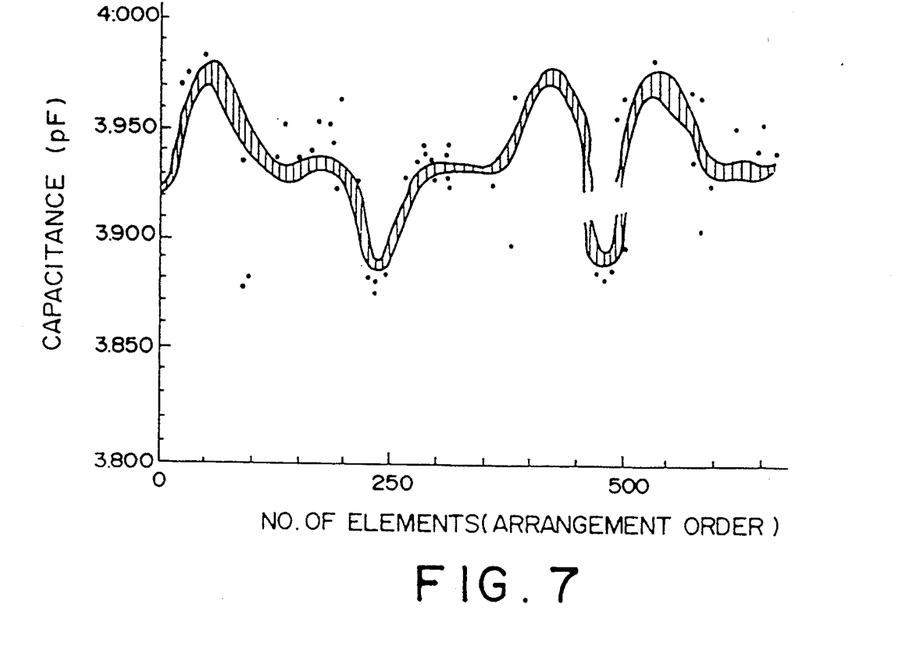
FIG. 7 is a graphical representation of a capacitance distribution along the element arrangement of this invention.

Generally, the capacitance distribution along the element arrangement of the variable capacitance diodes varies irregularly. FIG. 7 is a graphical representation showing an example of changes in the capacitance distribution wherein the abscissa represents the number of elements arranged in order of arrangement and the ordinate represents capacitance. The curve zone in the figure represents a distribution range. The change of this capacitance distribution can be approximated partially by the linear, quadratic, or logarithmic function, but it is difficult to approximate the capacitance distribution in the entire region of the element arrangement by a single function. In accordance with the testing method of this invention, an approach is employed to partially grasp or recognize changes in the capacitance in order of element arrangement (or judgment order) to represent a capacitance distribution in such a partial area with an approximate curve in accordance with the statistical technique to inspect or examine it by floating limits in which allowed values are set on the top and bottom of the approximate curve to remove elements having capacitance values deviating from the distribution thereafter to conduct the above-mentioned matching test. Thus, an efficient pairing ability judgment test can be conducted.

The automatic system using the testing method of this invention is called DPS (Direct Pairing System). This system has solved various problems described in the prior art and has considerably improved the reliability and the productivity of paired products.

What is claimed is:

1. A method of grouping variable capacitance diodes having uniform characteristics comprising the steps of:
  (a) separating element pellets of variable capacitance diodes arranged in a matrix form on a semiconductor wafer;
  (b) picking up pellets neighboring each other in any one of a longitudinal, lateral, and oblique direction in the matrix on the wafer;
  (c) rearranging the pellets picked up from the wafer in a row in a frame according to the order of picking up;
  (d) packaging the rearranged pellets in a row in accordance with an arrangement order from one end toward another end of a group of pellets in a row to form capacitor components;
  (e) measuring characteristics of the capacitor components;
  (f) performing first-type testing to reject defective capacitor components which have characteristics values deviating from acceptable value ranges determined by a tendency of values from the arrangement without breaking the arrangement order;

(g) performing second-type testing to obtain a group of successive good components in accordance with an arrangement order from a component to be judged toward one end of the arrangement; and (h) setting quality judgment criteria for components to be judged for every instance of second-type testing on the basis of results of the second-type testing, wherein step (h) includes the steps of (1) selecting a component having an initial representative value with respect to a predetermined number of rearranged components, (2) determining an acceptable range using the representative value as an initial reference value, (3) determining whether or not a next component has a value within the acceptable range and whether or not a ratio of a difference between a maximum capacitance value and a minimum capacitance value in the acceptable range to the minimum capacitance value is less than a predetermined value, (4) setting a new representative value for a predetermined number of components including a new component, and (5) repeating steps (1) to (4) for succeeding components to obtain a renewed representative value and allowable range.

2. A method as set forth in claim 1, wherein the rearranging step (c) includes arranging in order pellets picked up from the wafer by changing the pick up position by advancing in one direction along a plurality of rows to one end of the wafer, shifting in a column direction to adjacent rows, advancing in a reverse direction to another end of the wafer, and repeating these steps.

3. A method as set forth in claim 1, wherein the representative value is a center value.

4. A method as set forth in claim 1, wherein the representative value is a mean value.

* * * * *